US005466480A

United States Patent [19]
Zhou et al.

[11] Patent Number: 5,466,480
[45] Date of Patent: Nov. 14, 1995

[54] METHOD FOR MAKING AN NMR COIL

[75] Inventors: Dawei Zhou; Thomas Mareci, both of Gainesville, Fla.; Michael Burns, Mountain View; Ward Ruby, San Jose, both of Calif.

[73] Assignee: University of Florida, Gainesville, Fla.

[21] Appl. No.: 152,752

[22] Filed: Nov. 12, 1993

[51] Int. Cl.$^6$ ............... B05D 1/32; B05D 1/36; B05D 5/12

[52] U.S. Cl. ............ 427/63; 427/259; 427/261; 427/269; 427/250; 427/255.5; 427/124; 427/125; 505/844

[58] Field of Search ............ 427/125, 124, 427/259, 250, 62, 63, 255.5, 269, 261; 324/318; 505/844

[56] References Cited

U.S. PATENT DOCUMENTS

| | | | |
|---|---|---|---|
| 3,899,557 | 8/1975 | Dietze | 264/81 |
| 3,962,670 | 6/1976 | Deitze | 338/334 |
| 4,123,244 | 10/1978 | Leciercq et al. | 65/60 |
| 4,194,022 | 3/1980 | Gillery | 427/109 |
| 4,276,072 | 6/1981 | O'Brien | 65/3 |
| 4,326,929 | 4/1982 | Minezaki et al. | 204/15 |
| 4,327,122 | 4/1982 | Chakupurakal | 427/57 |
| 4,431,692 | 2/1984 | Hofmann et al. | 428/35 |
| 4,595,608 | 6/1986 | King et al. | 427/237 |
| 4,595,898 | 6/1986 | Shiraki et al. | 335/216 |
| 4,694,255 | 9/1987 | Hayes | 324/318 |
| 4,885,539 | 12/1989 | Roemer et al. | 324/318 |
| 5,367,261 | 11/1994 | Frederick | 324/318 |

OTHER PUBLICATIONS

Aguayo et al., "Nuclear magnetic resonance imaging of a single cell," *Letters to Nature*, vol. 322, Jul. 10, 1986, pp. 190–191.

Cho et al., "Three–Dimensional Microscopy toward in Vivo Cellular Imaging Using NMR Tomography," *J. Vis. Comm. & Image Rep.*, vol. 1, No. 1, Sep. 1990, pp. 56–66.

Murphy et al., "A Comparison of Three Radiofrequency Coils for NMR Studies of Conductive Samples," *Magnetic Res. in Med.*, 12, 382–389 (1989).

Cho et al., "Nuclear magnetic resonance microscopy with 4–um resolution: Theoretical study and experimental results," *Dept. of Rad. Sci.*, Univ. of Cal., Irvine, pp. 815–824, accepted for publication Jun. 20, 1988.

Kuhns et al., "Inductive Coupling and Tuning in NMR Probes: Aplications," *J. Magnetic Res.*, 78, pp. 69–76 (1988).

Decorps et al., "An Inductively Coupled, Series–Tuned NMR Probe," *J. Magnetic Res.*, 65, pp. 100–109 (1985).

Hoult, D. I., "The NMR Receiver: A Description and Analysis of Design," *Prog. in NMR Sepctroscopy*, vol. 12, pp. 41–77 (1978).

Schnall et al., "Wireless Implanted Magnetic Resonance Probes for in Vivo NMR," *J. Magnetic Res.*, 68, pp. 161–167 (1986).

*Primary Examiner*—Roy V. King
*Attorney, Agent, or Firm*—Needle & Rosenberg

[57] ABSTRACT

Three-dimensional RF coils suitable for use in NMR spectroscopy or imaging are described, as well as methods for making such coils. The coil is made from a thin-walled, non-magnetic, electrically insulating tube. The tube is then masked and a first conducting layer is applied, e.g., by evaporation. An additional insulating layer is provided on top of the first conducting layer, and then a second conducting layer is applied. An optional additional insulating layer may then be applied over the second conducting layer. The first and second conducting layer, in combination, are electrically connected to form a self-resonant structure at the selected frequency of the NMR apparatus. The coil may be fine-tuned conventionally by means of a series or parallel capacitor, or by changing the position of a conductive ring around the outside of the coil. Alternately, two tubes may be used, with only one conducting layer deposited on each. If two tubes are used, they are dimensioned to allow one tube to fit within the other. The two tubes may be twisted or telescoped to permit varying degrees of alignment of the conductive patterns deposited on the two tubes, which will serve to fine-tune the NMR tube's resonant frequency.

14 Claims, 3 Drawing Sheets

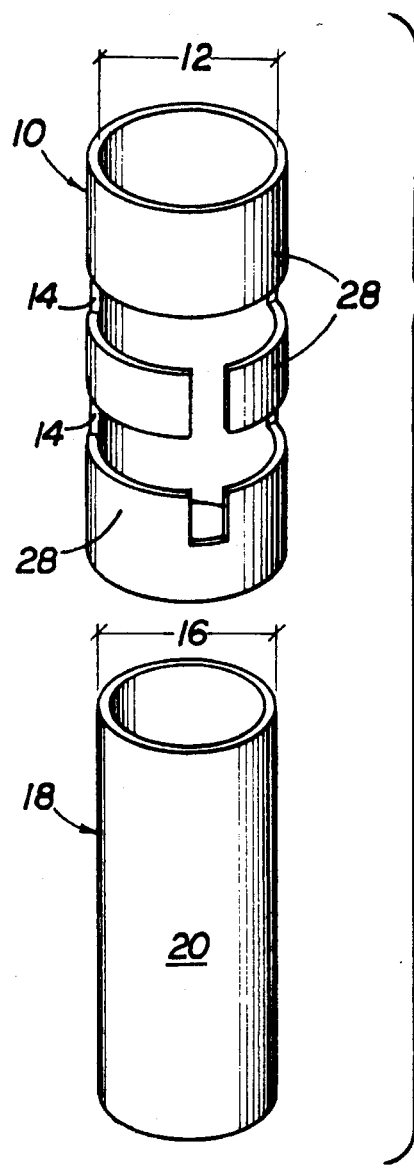
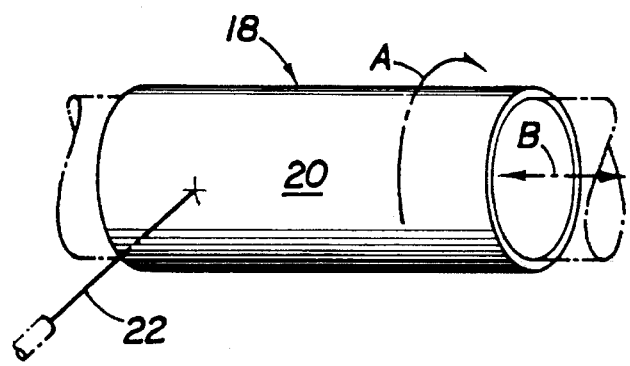
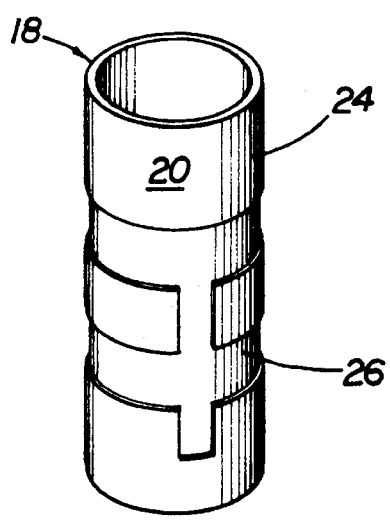
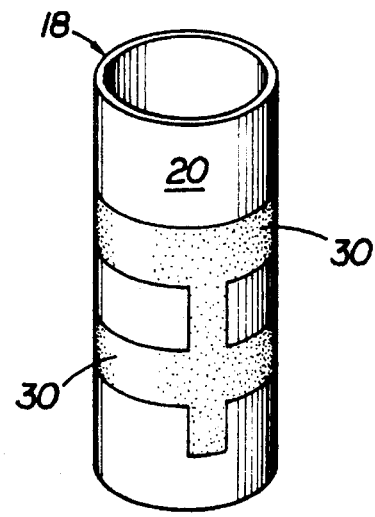
FIG 1
FIG 2
FIG 3
FIG 4

METHOD FOR MAKING AN NMR COIL

BACKGROUND OF THE INVENTION

1. Field of the Invention

This invention relates to a process for making nuclear magnetic resonance (NMR) apparatus and to the apparatus made thereby and more particularly to a novel process for making a radio-frequency coil for NMR imaging and spectroscopy.

2. Description of the Prior Art

It is well-known in the art that NMR images and spectra may be obtained from certain nuclei to determine the internal distribution and chemical form of the nuclei in a specimen. For many important applications, however, the chemical species being imaged is present in low concentrations. It is therefore desirable to increase the sensitivity of the imaging apparatus while maintaining a homogeneous magnetic field throughout the volume sample. Moreover, in microscopy and other very high resolution applications, the resolution is limited by factors including the small number of spins in a volume element and probe efficiency. Imaging efficiency, both in terms of sensitivity and resolution, can be increased by optimizing the signal-to-noise ratio (SNR) of the NMR apparatus. It has been stated that coil thermal noise is the dominant noise source in NMR microscopy [Cho et al., Nuclear magnetic resonance microscopy with 4-μm resolution: Theoretical study and experimental results, *Medical Physics*, Vol. 15, 1988, pp 815–824, at page 818].

NMR imaging coils, which typically are filled with a sample to be imaged, must also be tuned to a resonant frequency that depends upon the applied magnetic field. It is thus necessary to provide a capacitance with which to resonate the coil's inductance.

Prior art coil designs exist to optimize SNR for specific applications. For example, U.S. Pat. No. 4,885,539 to Roemer et al. describes a volume RF coil assembly of cylindrical form, including one embodiment of "birdcage" form. Conductor gaps are bridged with serially-connected capacitive elements. Other prior art designs include solenoid, slotted tube resonator (STR), and loop-gap resonator (LGR) designs [Murphy et al., A Comparison of Three Radiofrequency Coils for NMR Studies of Conductive Samples, *Magnetic Resonance in Medicine* 12:382–389 (1989)]. These are large-volume RF coil designs for use with conductive samples. All of these designs require the use of discrete capacitors, either on or as part of the coil assembly itself (as in the Roemer et al. design and the LGR design) and/or some combination of chip capacitors and variable air capacitors.

Inductive coupling and tuning of resonant circuits are well known in the art of radio engineering and have more recently been described in connection with NMR probe circuits [Kuhns, Inductive Coupling and Tuning in NMR Probes; Applications, Journal of Magnetic Resonance 78:69–76 (1988)]. The arrangement disclosed in this reference avoids the use of conventional, high-voltage tuning capacitors, and is suitable for iron-core magnets. Instead, the sample coil is tuned by a fixed capacitor, which is chosen to resonate the sample coil slightly below the operating frequency. Other probe circuits shown in this reference use conventional capacitive tuning, include variable capacitors in conjunction with the sample coil, or require conventional porcelain chip capacitors to resonate the sample coil. However, a high-Q coil requires a low L/C ratio, making it difficult to tune such circuits by conventional variable capacitors, because the inductance of the connecting wires typically exceeds that of the coil. The solution suggested in Kuhns is a self-contained resonator formed from overlapping conductors, the capacitor being formed in the overlap by separating the conductors by a Teflon® tape.

Inductively-coupled NMR coils are also known [Decorps et al., An Inductively Coupled, Series-Tuned NMR Probe, *Journal of Magnetic Resonance* 65:100–109 (1985)]. In the coil described in this reference, a series capacitor is inserted in the middle of the NMR coil to further reduce the electric losses and the shifts of the resonance frequency due to the introduction of a living sample or to movement of the sample.

It would be advantageous in an NMR coil to be able to position matching and tuning capacitors directly beside the inductors to improve the signal-to-noise ratio and to be able to fabricate the NMR resonating circuit as close to the sample as possible to increase filling factor (i.e., the ratio of actual sample volume to the cavity volume). Moreover, since we have found that shape defects in the coils cause a significant reduction in signal-to-noise ratio, it would also be advantageous to have a method of manufacturing NMR coils without shape defects easily, inexpensively, and in large quantities. Such coils should be useful for a broad range of applications from spectroscopic NMR to NMR microimaging.

BRIEF SUMMARY OF THE INVENTION

In accordance with this invention, a method of producing a three-dimensional RF coil suitable for NMR use having the aforementioned advantages is described. This method comprises the steps of (a) preparing a mask for a thin-walled, non-conductive, non-magnetic tube; (b) depositing a conductive pattern on the tube surface as desired; (c) coating a dielectric layer on top of the conductive layer in a desired pattern; and (d) depositing another conductive layer onto the dielectric layer in a desired pattern, thereby creating an NMR coil comprising an inductor with matching and tuning capacitors formed on the tube surface by deposition. Since the sample is placed inside the tube, the thinness of the wall allows the sample to be placed as close to the coil (which is the first conductive layer deposited on the outside of the tube) as possible.

BRIEF DESCRIPTION OF THE DIAGRAMS

FIG. 1 is a drawing of an NMR tube and a cylindrical mask, showing how the cylindrical mask is placed on the tube in preparation for the deposition of a conductive layer. (The same type of mask may also be used for the deposition of an insulating layer.)

FIG. 2 is a drawing of an alternate method for masking an NMR tube using photoresistant material.

FIG. 3 is a drawing showing the photoresistant covering of an NMR tube being prepared in accordance with the invention after the photoresistant material is exposed and developed.

FIG. 4 is a drawing of a first conductive layer of a coil deposited on an NMR tube.

Figure 5:
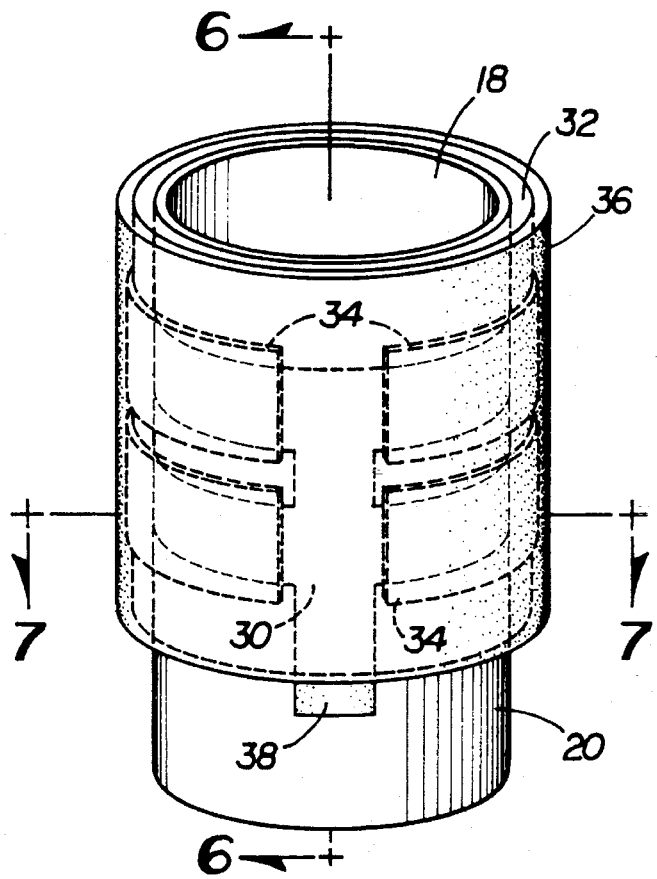
FIG. 5 is a drawing of an embodiment of an NMR coil in accordance with the invention.
Figure 7:
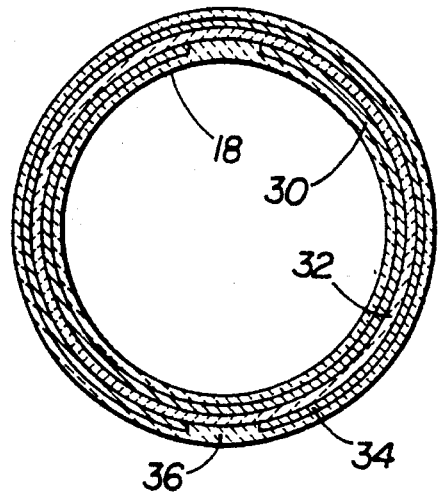
FIG. 7 is a cross-section of the surface of the coil of FIG. 5 along a travis axis showing another view of the relationship of the various deposited layers.
Figure 6:
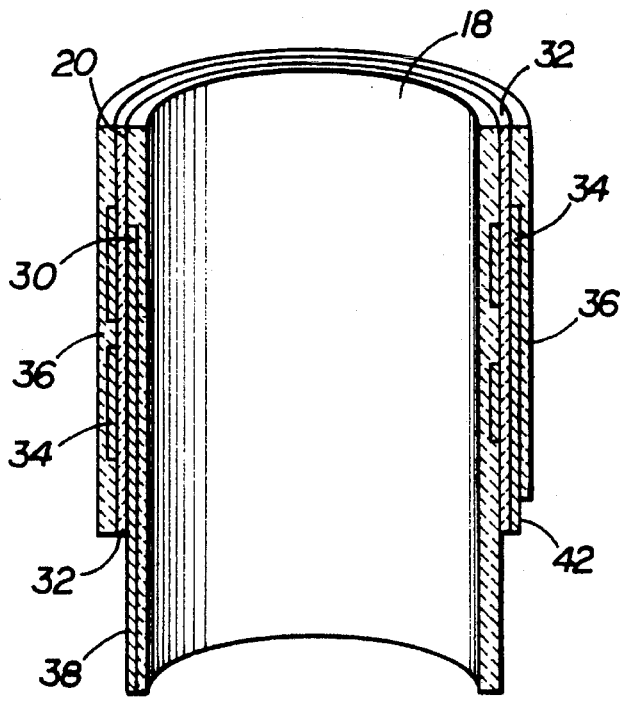
FIG. 6 is a cross-section of the coil of FIG. 5 along a longitudinal axis showing the various deposited layers.
Figure 8A:
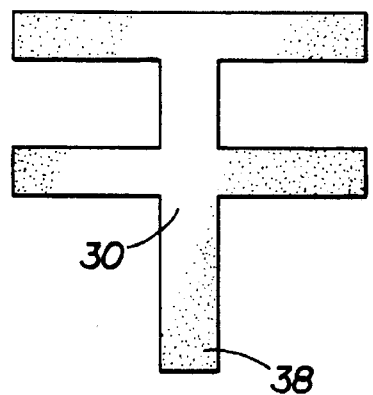

FIGS. 8(a) and (b) are projections of the inner and outer conducting layers, respectively, of the embodiment shown in FIGS. 5–7.

Figure 9A:
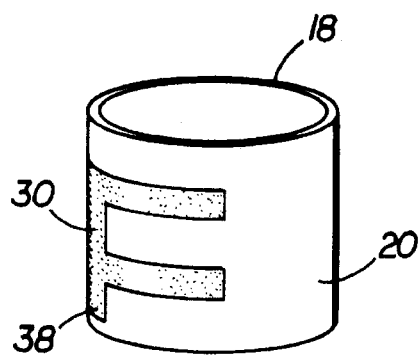

FIGS. 9(a), (b) and (c) show side views of the coil shown in FIG. 5 at various stages during the manufacture thereof.

Figure 10A:
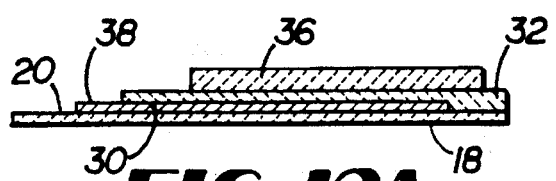

FIGS. 10(a) and (b) are cross-sectional views of the front and rear contact areas, respectively, of the coil shown in FIG. 5.

Figure 11:
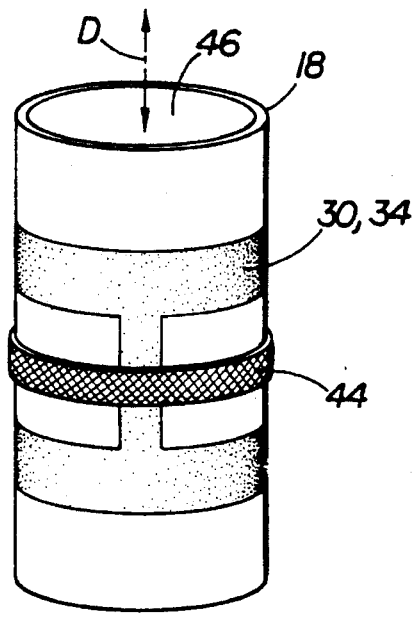

FIG. 11 is an illustration of a NMR coil in accordance with the invention showing a conductive ring used for fine tuning the resonant frequently of the coil.

Figure 12:
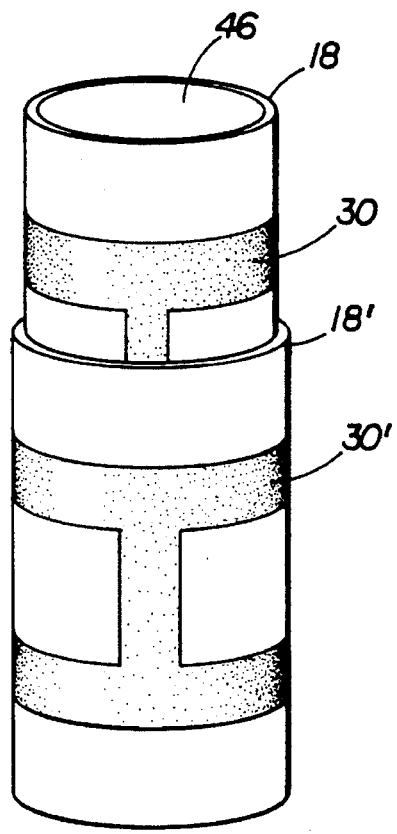

FIG. 12 is an illustration of an alternate embodiment of the invention in which the adjustable superposition of layers of conducting material on concentric, slidably engageable tubes is used for fine tuning.

It is to be understood that the figures are not necessarily drawn to scale.

DETAILED DESCRIPTION OF THE INVENTION

A three-dimensional RF coil in accordance with the invention is produced on at least one thin-walled, non-magnetic, electrically insulating tube. The tube may comprise a material such as glass, quartz, or sapphire, for example, although many other materials could be used.

A mask is prepared to permit a conductive pattern to be deposited on the tube. The mask may be formed by any suitable method. One such method employs a metal cylinder 10, as in FIG. 1, having an inside diameter 12 slightly larger than the outside diameter 16 of the tube 18 on which the NMR coil is to be formed. An electric discharge machine (EDM) may be used to cut through the metal cylinder 10 before it is placed over the tube 18. A high-voltage electrical current is used in the EDM to cut through the metal and produce hole(s) 14 corresponding to the desired metal layer to be deposited in the next step. The cylinder 10 may be rotated axially in the EDM to permit the cutting of the required pattern. Alternately, a laser may be used to cut the pattern in the metal tube.

Of course, the EDM and laser methods may be used with a cylinder of some material other than metal. However, metal tubes cut easily in the EDM and laser cutting tools and the resulting metal mask can be made strong enough to be used many times in the coil manufacturing process.

Another method for producing a pattern employs a photoresistance material. In this case, shown in FIG. 2, the outer surface 20 of tube 18 is covered with a photoresist and is then exposed a light source. The tube may be turned on its axis (as indicated by arrow A) and moved back and forth along its axis (as indicated by arrow B) while a light beam 22 (from a source not shown in FIG. 2) is focused on the portions of the photoresist covering surface 20 to be removed or to remain. Since positive photoresists are used almost exclusively in modern photolithography of integrated circuits and other fine-line structures, we shall describe the process assuming such photoresists are used, noting that, with the obvious modifications, negative photoresists could also be used. The photoresist is then developed to create the mask. The pattern created in the photoresist should allow photoresist in the developed mask to remain where the deposit of the first conductive layer is not desired. This method is not as desirable as the use of a cylindrical metal mask because it must be repeated with each RF coil produced, whereas a single cylindrical metal mask could be used repeatedly. A sample pattern is shown in FIG. 3. This pattern has a layer 24 of photoresist having an area 26 removed to allow the surface of the tube 18 to be exposed for the deposition of a conductor.

The next step is to deposit a conductive pattern on the tube surface as desired. The conductive layer is preferably gold, silver, copper, or aluminum, but it may be any other conductive metal or compound. For some applications, the use of a superconductive material (such as, for example, lead, niobium, or any other superconductive material that can be applied to the surface of a cylinder) may be more preferable. If so, the Q-factor of the coil can be increased by a factor of approximately 10 to 100. (The Q-factor, which increases in inverse proportion to the coil's resistance, will not be infinite because of some finite resistance caused by the non-linear shape of the superconductor and the use of other than DC current through it.)

The conductive layer is deposited by any suitable method, such as by evaporation. One such method is described in U.S. Pat. No. 4,123,244 to Leclercq et al., the specification of which is hereby incorporated by reference in its entirety. This reference describes a process of forming a metal or metal compound coating on a face of a glass substrate and an apparatus suitable for use in forming such a substrate. The method comprises the steps of contacting the glass substrate, while it is at an elevated temperature, with a gaseous medium containing a substance in gaseous form, which undergoes chemical reaction or decomposition to form the metal or metal compound on its face. In the case of an NMR coil in accordance with the present invention, a glass NMR coil tube would preferably be rotated to ensure even deposition of the conductive material around the tube. Any other standard method of depositing a film on the coil could also be used.

Depending upon the mask produced in the first step of the process, the conductive layer is either deposited through a cylindrical mask 10 having holes 14 corresponding to portions of the tube 18 to be coated with the conductive material (as in FIG. 1) or directly onto the tube surface 20 after the removal of the exposed (or unexposed, if negative resist material is used) portion of the photoresist (as in FIG. 3). In the former case, the diameter of the cylindrical mask 10 shown in FIG. 1 should allow it to fit snugly over the tube 18. The deposition is masked by the portions 28 of the cylinder 10 that have not been cut away, with deposition occurring on the tube 18 in a pattern corresponding to the holes 14 in the cylinder 10.

If a photoresist mask is used as in FIG. 3, the photoresist is exposed and developed prior to the deposition. The conductive layer is then deposited directly on top of the portion of the surface 20 of tube 18 that was covered by photoresist, including the portion 26 removed after exposing the photoresist to light and developing. Any remaining photoresist 24 is then removed, for example, by dissolving it in solvent. The portions of the conductive layer deposited on photoresist 24 will be removed by the dissolution of the photoresist layer 24 beneath them, which causes the overlying conductive layer to disintegrate. As shown in FIG. 4, those portions 30 of the conductive layer deposited directly on the surface 20 of tube 18 (i.e., through gaps 24 in the photoresist in FIG. 3) remain to form the desired RF coil pattern 32. Although FIG. 4 has been described in conjunction with the photoresist method of producing the NMR coil, it will be readily appreciated that the figure is also representative of an NMR coil produced with a cylindrical mask 10.

The first conductive layer can be of any desired thickness, with thicknesses between about 100 and about 20,000 Å being preferred. (Although thinner and thicker films are possible, thinner films tend to have microscope voids, while thicker films tend not to adhere adequately.) Suitable widths for the conductive layer depend upon the Q desired of the coil, since the width and thickness of the deposited layer, together with the conductance of the deposited material, determine the resistance, and hence the losses, in the coil. In addition, since a resonating capacitor will be formed in a subsequent step using the first conductive layer as one of its surfaces, the selection of a width will be dependent both upon the desired RF resonant frequency and the accuracy to which the deposition of the outer conductive layer can be aligned with the inner conductive layer. However, with the preferred thicknesses, widths around 100 microns are generally preferred for ease of manufacturing, since shadow masks readily allow widths down to about 100 microns, with 1–2 microns being the limit for easy photolithography. However, widths down to 0.2 or 0.1 microns could be obtained with X-ray lithography, and even lesser widths are possible with electron beam lithography.

The third step is to deposit an insulating dielectric layer on top of the first conductive layer. This insulating layer may be deposited by any standard means, such as deposition, spraying, or immersion. In general, it is necessary to pattern every layer, and thus, the shadow masking technique or a standard masking technique should be used for patterning the dielectric layer. The insulation layer should be between about 1000 Å and a few microns thick to provide adequate physical protection of the conductive layer, and it may be of any dielectric material suitable for deposition. The dielectric material should have as low a loss-tangent as possible so that the cavity Q will be as high as possible. A non-exhaustive list of such materials includes $SiO_2$, $Al_2O_3$, and polymers having suitable dielectric properties, such as Mylar®, and Teflon®. As was the case with the width of the first conduction layer, the thickness of the insulation layer is dependent upon the desired RF resonant frequency desired, because this layer will serve to separate the two conductive layers, thereby forming a resonating capacitor for the RF coil. Portions of the first conductive layer 30 should be left exposed (i.e., uncovered by the dielectric layer) to allow an electric contact to be made to the first conductive layer. A mask may be applied after the deposition of the first conductive layer and prior to the deposition of the insulating dielectric layer to provide a predetermined pattern for the dielectric layer. This pattern can allow for a portion of the tube and/or the first conductive layer to be uncovered. The patterned dielectric can be applied in a manner similar to that of the first conducting layer, using a suitable mask.

The fourth step is to deposit a second conductive layer onto the dielectric layer in a desired pattern. This fourth step may require that the tube (the operative portion of which is, by this step, coated with dielectric around its circumference) again be masked in a manner similar to that performed in the first step, followed by deposition of the second conductive layer. The alignment required is well within the range of normal skill of EDM machinist. Generally, alignment can be done optically, using alignment marks on the masks. If the first mask produced in the process was a cylindrical mask made by an EDM or laser, it may also serve as a mask for use in depositing the second conductive layer. The width and thickness of the second metal layer may be in the same range as that of the first metal layer. The second conductive layer may form a series or parallel capacitance with the first conductive layer, depending upon the preferred electrical arrangement. Alternately, connecting wires may be bonded or otherwise attached to bonding pads formed in the layers. This latter method is also the preferred method for connecting leads to the finished RF coil for connection to the NMR circuitry.

The second conductive layer is preferably covered by a second layer of dielectric to provide the second conductive layer with resistance to mechanical wear and to provide electrical insulation.

The resonant frequency of the NMR coil will depend upon the thickness and dielectric constant of the insulator and the amount of overlap between the first and second conductive layers. All relevant electrical properties of the coil, including the inductance, capacitance, and resonant frequency, may be designed in accordance with well-known electrical formulas; see, for example, Jackson, Classical Electrodynamics, 1962, 1975, published by John Wiley & Sons.

Figure 8B:
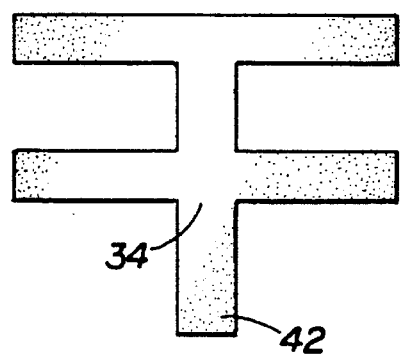

A finished coil made in accordance with the invention is shown in FIG. 5. The first conducting layer 30 is deposited directly on the surface 20 of tube 18. An insulating dielectric layer 32 separates the first conducting layer 30 from the second conducting layer 34, thereby producing a capacitor. The second insulating layer 36 is deposited over the second conducting layer 34 for physical and electrical protection of the completed assembly. Contact areas 38 and 42 (the latter not shown in FIG. 5) in the first and second conducting layers 30 and 34, respectively, are left exposed to allow electrical connection to the NMR coil by soldering, conductive epoxy, gap welding, or wire bonding or any other suitable bonding technique. Conductive epoxy is preferred for low volume prototyping, while gap welding is generally preferred for production units. A longitudinal section of the coil shown in FIG. 6, showing the generally concentric nature of the layers applied to tube 18. Contact area 42 at the rear of FIG. 5 is shown in FIG. 6. FIG. 7 is a traverse section of the coil shown in FIG. 5, showing the relationship of deposited layers 30, 32, 34 and 36. As a further aid in understanding the figures, FIG. 8(a) shows first conducting layer 30 as it would appear if it could be "unwrapped" from the completed coil and flattened into a plane; FIG. 8(b) shows second conducting layer 34 as it would appear similarly "unwrapped." Contact areas 38 and 42 are positioned 180° around tube 18 from one another.

Figure 9B:
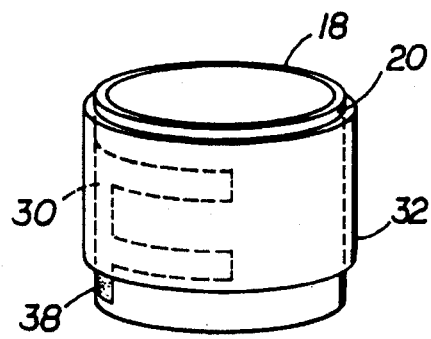
Figure 9C:
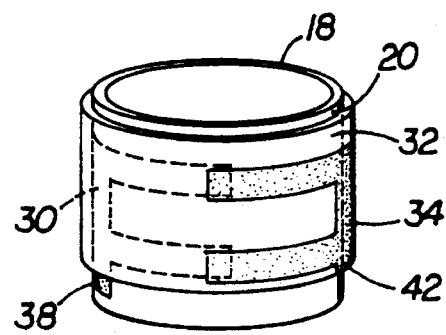

FIGS. 9(a)–(c) show side views of a coil similar to that shown in FIG. 5, but with less overlapping of first conducting layer 30 and second conducting layer 34, and, therefore, less capacitance between them, and without optional second insulating layer 36. FIG. 9(a) shows the coil after first conducting layer 30 is applied; FIG. 9(b) shows the coil after first insulating layer 32 is applied, and FIG. 9(c) shows the coil after the second conducting layer 34 is applied.

Figure 10B:

FIGS. 10(a) and (b) show cross sections of the surface of a coil in accordance with the invention, showing a possible configuration of the insulating and conductive layers at two different portions of the coil at which the first conducting layer 30 and the second conducting layer 34 do not overlap. FIG. 10(a) shows the first conducting layer 30 applied over the surface 20 of tube 18, with both a first 32 and second 36 insulating dielectric layer deposited over it. FIG. 10(a) also shows a contact area 38 of first conductive layer 30 extending beyond the first 32 and second 36 insulating layers. FIG. 10(b) shows a different part of the coil, with a second conducting layer 34 having a contact area 38 extending beyond the covering second insulating layer 36. Although the contact area 38 is shown here above the first insulating layer 32, any other profile allowing contact to the contact area 38 that provides conductivity with the rest of the conducting layer 34 may be used.

Although an RF coil formed by the method of this invention has an integral capacitor between the first conductive layer 30 and the second conductive layer 34 for resonance, because of manufacturing tolerances and other tuning requirements (such as variations in the NMR magnetic field), additional fine tuning is likely to be required. This fine tuning can be accomplished in at least three ways.

The first, preferred method is to provide a tight-fitting conductive ring 44 around the NMR tube 18 as shown in FIG. 11. Changing the position of the ring 44 on the tube 18 (i.e., moving it up or down as indicated by arrow D) changes the coupling between the ring 44 and the capacitor between the layers 30 and 34 (shown superimposed in FIG. 11), the main effect of which is to change the total capacitance. This adjustment can be accomplished while watching the RF signal level in the circuit. Once the desired resonant frequency is obtained, as indicated by the maximization of the RF signal, the ring 44, which fits tightly around the optional additional insulation and passivation layer 36 may simply be left in place and the ring fixed in place with a suitable non-conducting adhesive prior to shipping. The final passivation layer 36 (of, e.g., polyimide) helps to prevent abrasion. The specimen is placed in the interior 46 of tube 18.

A second method for tuning is illustrated in FIG. 12. This method uses an alternate technique for making the NMR coil. In this method, two tubes 18 and 18' are used. The innermost tube 18 is constructed in accordance with the first two steps of the process and therefore has only a first conducting layer 30. For protection of layer 30, a protective dielectric layer corresponding to optional insulating layer 36 in FIGS. 5 and 6 (but not shown in FIG. 12) is preferably applied to tube 18, including the conducting layer 30. The thin outer tube 18' which has a conducting layer 34' and is optionally protected by an additional insulating layer (not shown), is slidingly engaged over the inner tube 18. The conductive layer 34' on the outer tube 18' may be moved into and out of alignment with the conductive layer 30 on the inner tube 18 by relative rotation and/or translation of the tubes 18 and 18', thereby adjusting the capacitance between the two conductive layers 30 and 34'. Electrical contacts may be made to the conducting layers 30 and 34' in any suitable manner as described above, for example, soldering, gap welding, conductive epoxy, or wire-bonding. In this embodiment, the dielectric constant and thickness of the outer tube 18' must be taken into consideration, since it is part of the material between the conductive layers 30 and 34' and must be considered in determining the maximum capacitance that can be obtained for any given amount of overlap of the conductive layers 30 and 34'. The sample is placed in the interior 46 of tube 18.

The third method of adjusting the resonant frequency of the coil is by using an external capacitor in a conventional series or parallel connection with the coil. This circuit arrangement is likely to be the most susceptible to noise of the methods described, however.

The preferred coil embodiments described herein are capable of mass production, and can be manufactured inexpensively enough to be considered disposable. Moreover, the use of three-dimensional masking techniques avoids shape defects that contribute to degradations in NMR noise level. The coils have the further advantages that the matching tuning capacitor is fabricated as close to the inductor as possible, resulting in further improvement of signal-to-noise ratio, and that the resonating circuit is as close to the sample as possible to increase filling factor. The technique lends itself to various coil configurations, and is not limited to solenoid or "birdcage" configurations. It is particularly well-suited for coil types like birdcages, however, because discrete capacitors can be replaced by overlapping inner and outer conductor layers separated by insulator to achieve the required capacitance.

Of course, the invention is not restricted to the preferred coil embodiments described, which are intended only to illustrate the invention. Many modifications will be readily apparent to one skilled in the art without departing from the spirit of the invention.

What is claimed:

1. A method for making an NMR coil on an electrically non-conductive outer surface of an NMR tube, comprising the steps of:

a. applying a first mask to the outer surface such that the first mask divides the surface area of the tube into a first masked portion and a first unmasked portion, wherein the first unmasked portion defines a first preselected pattern;

b. depositing a first layer of conducting material onto the first unmasked portion to form a first conducting layer in the first preselected pattern;

c. removing the first mask from the tube;

d. depositing a layer of an insulating material onto the outer surface to form an insulation layer, wherein the insulation layer is superimposed onto the first conducting layer so as to continuously cover the first conducting layer except at at least one preselected point;

e. applying a second mask to the outer surface such that the second mask divides the surface area into a second masked portion and a second unmasked portion, wherein the second unmasked portion defines a second preselected pattern and wherein the second unmasked portion is superimposed over at least a portion of the first conducting layer; and f. depositing a second layer of conducting material onto a third unmasked portion to form a second conducting layer, wherein the second conducting layer is superimposed onto the insulation layer and wherein the first conducting layer, the insulation layer and the second conducting layer form an integrated resonance circuit having at least one inductor and at least one capacitor located on the outer surface of the NMR tube.

2. The method of claim 1 wherein at least one of the masks comprises a cylinder capable of tight, slidable engagement over the outer surface of the NMR tube, the cylinder having apertures through which the conducting material comprising at least one of the conducting layers is deposited, and wherein the application of the at least one of the masks comprising the cylinder comprises sliding the cylinder over the outer surface of the NMR tube.

3. The method of claim 2 wherein at least one of the conductive layers is deposited by thin film deposition techniques.

4. The method of claim 3 wherein the tube is rotated during evaporative deposition to ensure even deposition of the conductive material onto the tube.

5. The method of claim 4 wherein the NMR tube comprises a non-conductive, non-magnetic dielectric material.

6. The method of claim 4 wherein the NMR tube comprises a material selected from the group consisting of glass, sapphire and quartz.

7. The method of claim 4 wherein the NMR tube comprises glass.

8. The method of claim 4 wherein the NMR tube comprises sapphire.

9. The method of claim 4 wherein the NMR tube comprises quartz.

10. The method of claim 1 wherein the conductive material comprises a superconductor.

11. The method of claim 1 wherein at least one of the mask application steps comprises the substeps of covering the surface of the tube with a photoresistant material, exposing to light portions of the photoresistant material corresponding to the unmasked portion of the application step, and developing the photoresistant material to remove the portions of the photoresistant material corresponding to the unmasked portion of the application step.

12. The method of claim 11 wherein at least one of the conductive layers is deposited by evaporative deposition.

13. The method of claim 12 wherein the tube is rotated during the evaporative deposition to ensure even deposition of the conductive material onto the tube.

14. The method of claim 13 further comprising the additional step of applying an insulating protective layer over the second conductive layer to electrically and physically protect the NMR coil.

* * * * *